(12) United States Patent
Kickhefel et al.

(10) Patent No.: US 10,054,659 B2
(45) Date of Patent: Aug. 21, 2018

(54) METHOD AND APPARATUS FOR ACQUIRING MAGNETIC RESONANCE DATA FROM A TARGET REGION WHILE THE TARGET REGION MOVES DUE TO RESPIRATION

(71) Applicant: Siemens Aktiengesellschaft, Munich (DE)

(72) Inventors: Antje Kickhefel, Erlangen (DE); Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 417 days.

(21) Appl. No.: 14/845,810

(22) Filed: Sep. 4, 2015

(65) Prior Publication Data

US 2016/0069976 A1    Mar. 10, 2016

(30) Foreign Application Priority Data

Sep. 4, 2014   (DE) .................. 10 2014 217 729

(51) Int. Cl.
*G01V 3/00*   (2006.01)
*G01R 33/567*   (2006.01)
*G01R 33/48*   (2006.01)
*G01R 33/483*   (2006.01)
*G01R 33/561*   (2006.01)

(52) U.S. Cl.
CPC ..... *G01R 33/5676* (2013.01); *G01R 33/4828* (2013.01); *G01R 33/4838* (2013.01); *G01R 33/5617* (2013.01)

(58) Field of Classification Search
CPC ............ G01R 33/5676; G01R 33/4828; G01R 33/4838; G01R 33/5617

USPC ......................................................... 324/309
See application file for complete search history.

(56) References Cited

U.S. PATENT DOCUMENTS

| 2012/0161765 | A1  | 6/2012 | Takei |
| 2012/0245453 | A1* | 9/2012 | Tryggestad ............ A61B 6/463 600/413 |
| 2013/0035588 | A1* | 2/2013 | Shea ................... G01R 33/4833 600/413 |

FOREIGN PATENT DOCUMENTS

| JP | 2007130397 A | 5/2007 |
| JP | 2011110328 A | 6/2011 |

OTHER PUBLICATIONS

Song et al., "Flexible Cardiac T1 Mapping Using a Modified Look-Locker Acquisition With Saturation Recovery," Magnetic Resonance in Medicine, vol. 67, pp. 622-627 (2012).

* cited by examiner

*Primary Examiner* — Susan Lee
(74) *Attorney, Agent, or Firm* — Schiff Hardin LLP

(57) ABSTRACT

In a method for recording magnetic resonance data in a target region of a patient while the target region moves due to respiration a single-shot turbo spin echo sequence is used as a magnetic resonance sequence in a magnetic resonance apparatus. SPAIR fat saturation is used by emitting an inversion pulse at an inversion time before the data recording with the magnetic resonance apparatus. Multiple repetitions of the sequence of an inversion pulse, an inversion time and a data recording using the magnetic resonance sequence are triggered by a respiratory signal describing the respiratory cycle, each repetition occurring upon fulfillment of a recording criterion. At least one further inversion pulse is emitted in a waiting time between the sequences.

8 Claims, 3 Drawing Sheets

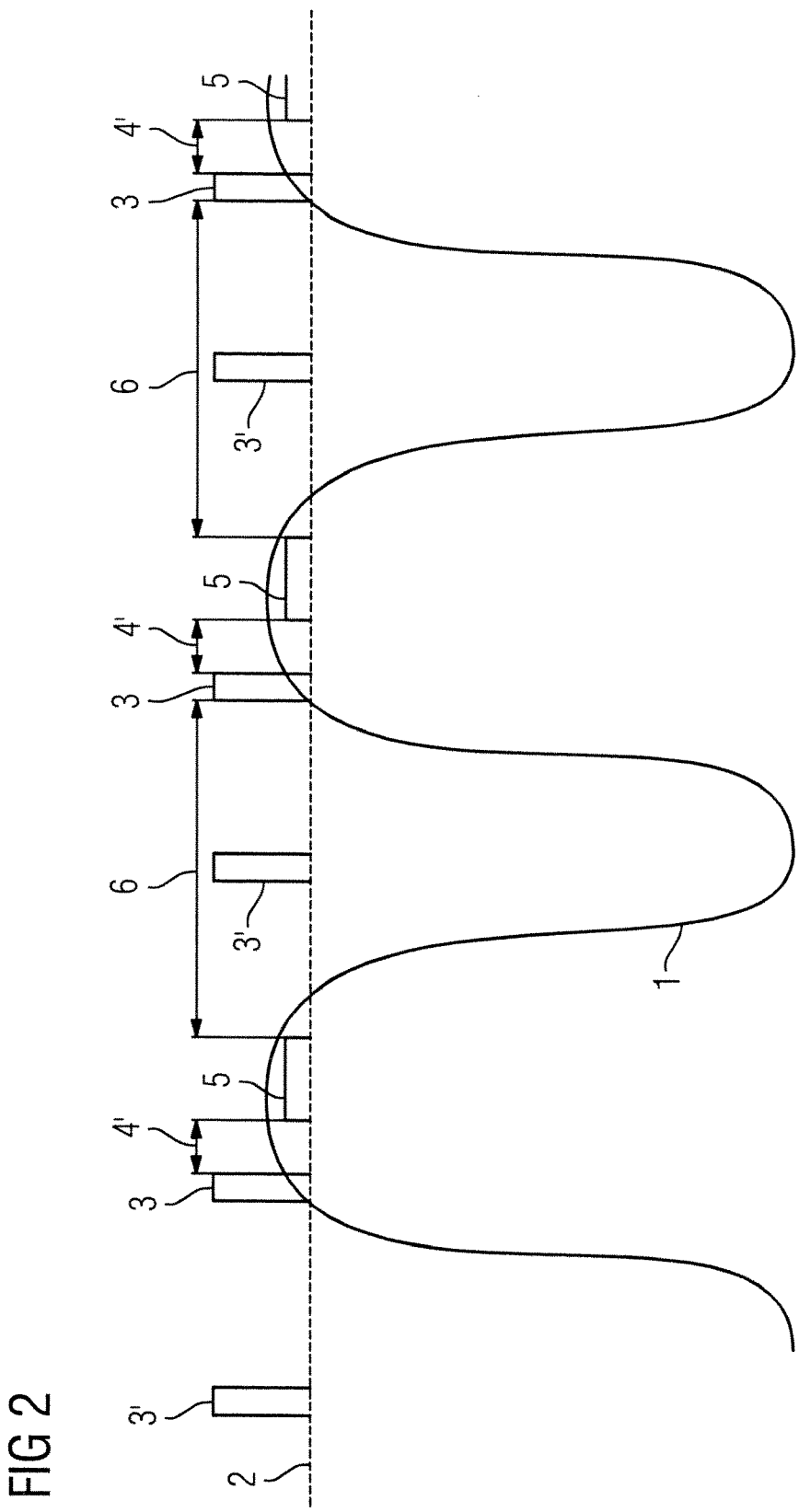

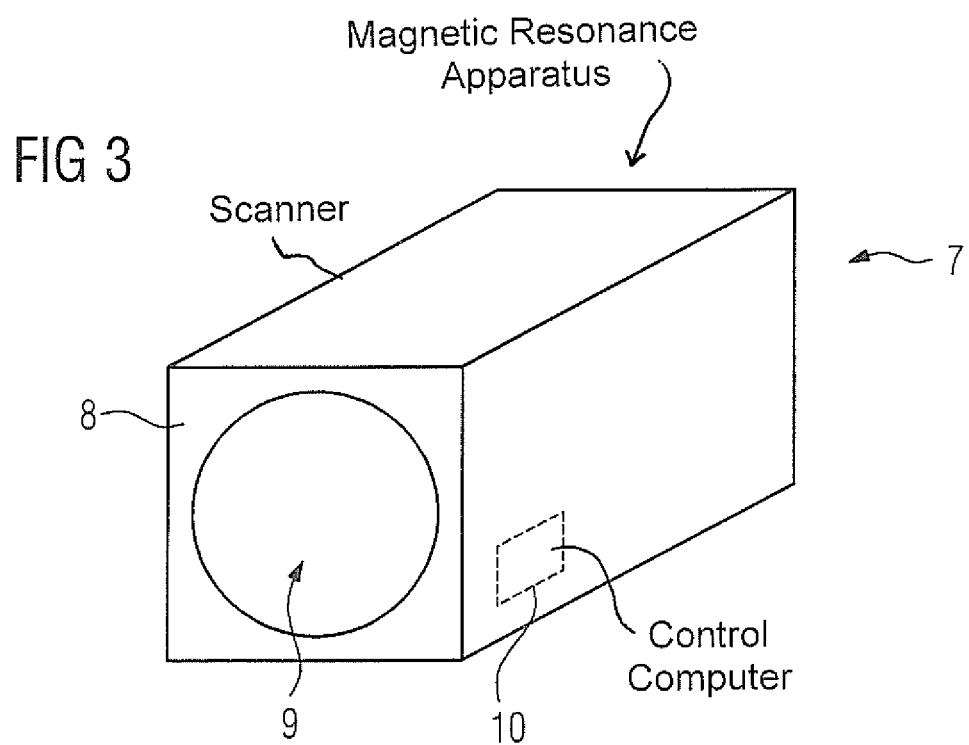

METHOD AND APPARATUS FOR ACQUIRING MAGNETIC RESONANCE DATA FROM A TARGET REGION WHILE THE TARGET REGION MOVES DUE TO RESPIRATION

BACKGROUND OF THE INVENTION

Field of the Invention

The invention concerns a method for acquiring magnetic resonance data from a target region of a patient while the target region moves due to respiration, using a single-shot turbo spin echo sequence as a magnetic resonance sequence in a magnetic resonance apparatus, wherein SPAIR fat saturation is used in a data acquisition sequence, by emitting an inversion pulse at an inversion time before data acquisition in the sequence, and wherein multiple repetitions of sequence are respectively triggered by a respiratory signal describing the respiratory cycle upon fulfillment of a recording criterion. The invention additionally concerns a magnetic resonance apparatus for implementing such a method.

Description of the Prior Art

In magnetic resonance data acquisitions from regions that are affected by respiration of the patient, for example in the chest region, the movement caused by respiration represents a problem which can result in poorer quality magnetic resonance data if the respective data acquisitions occur at different phases of the respiratory cycle and/or too much movement occurs during the data acquisition. Hence various recording techniques are known to address this problem, most of which are based on triggering by a respiratory signal. For example, the data recording (acquisition) can be triggered when a particular recording criterion indicating a resting phase of respiration in the respiratory signal is fulfilled. For example, such a trigger can be set for a particular expiration value or the like.

However, it is frequently the case with such measurements, especially in the chest region, that fat saturation is also desired in order to suppress fat signal components in the acquired magnetic resonance data. A frequently used recording technique combines single-shot turbo spin echo measurements (single-shot TSE measurements), for example a HASTE sequence (HASTE=Half-Fourier Acquisition Single-Shot Turbo Spin Echo), with SPAIR fat saturation (SPAIR=Spectral Adiabatic Inversion Recovery). In this case, a spectrally selective adiabatic inversion pulse is emitted that inverts the fat spins in the analyzed volume. The fat spins now decay in accordance with the T1 relaxation time, and after a particular characteristic time (inversion time) the longitudinal magnetization is zero, so that at this point an excitation pulse can be emitted. With SPAIR the achievement of a steady state is a prerequisite for uniformly good fat saturation. The inversion time, for which it is necessary to wait after the emission of the inversion pulse before the actual data recording, depends on the repetition time, which results in longer inversion times (TI) in the case of single-shot turbo spin echo sequences, this being the case for the HASTE sequence in particular.

In the case of respiratory triggering, this means that the SPAIR inversion pulse is emitted initially and the actual data recording follows only after a (long) waiting time, the inversion time TI. Since the recording criterion is used to evaluate the respiratory signal such that it can be determined as reliably as possible that a relative rest phase in the respiratory movement will follow, the moment of triggering and thus the moment of emitting the inversion pulse is not randomly displaced within the respiratory cycle, so that with long inversion times there is a risk that during the data recording, in which the single-shot TSE sequence is executed, a stronger respiratory movement is present and thus poorer quality magnetic resonance data are recorded.

Furthermore, the inversion time is ultimately the result of the time needed for the longitudinal magnetization of the fat spins to achieve zero crossover. This, in turn, depends on how high the longitudinal magnetization was before the inversion pulse was emitted. Thus if several sequences or measurement blocks each including an inversion pulse, an inversion time and a magnetic resonance sequence, are performed in successive respiratory cycles, a particular respiratory frequency must be taken as the basis for determining how far the longitudinal magnetization of the fat spins has already progressed, from which the inversion time results. However, if the respiratory frequency changes, the actual previously-calculated inversion time is no longer correct. The effects are in this case not a complete failure in fat saturation, but disruptive fluctuations can occur in the fat intensity.

SUMMARY OF THE INVENTION

An object of the invention is, in the case of triggered single-shot TSE measurements with SPAIR fat saturation, to achieve an improved quality of magnetic resonance data with respect to fat saturation.

This object is achieved in accordance with the invention by a method of the type described above wherein at least one further inversion pulse is emitted in a waiting time between the repeated sequences.

In accordance with the invention, the SPAIR preparation is emitted several times in a recording pause between different sequences or measurement blocks. Conventionally, the SPAIR preparation takes place in each case only before the actual data recording, thus the emission of the magnetic resonance sequence. It should be noted that although the SPAIR inversion pulse is in each case emitted before the measurement of a slice, it is not itself slice-selective, but always saturates the entire volume (normally in each case whole slices are recorded in a sequence inversion pulse, inversion time and magnetic resonance sequence). By emitting the inversion pulse multiple times, a continuous or quasi-continuous SPAIR fat saturation is achieved in single-shot TSE recordings, in particular HASTE recordings. This means that the longitudinal relaxation of the magnetization of the fat spins does not result in high amplitudes, so that the inversion time can be significantly reduced. Therefore, after the fulfillment of the recording criterion, namely the trigger, it is possible to start the actual data recording in connection with the magnetic resonance sequence more quickly. As a result, not only is it possible to achieve more reliable measurements in a state of little movement, but also the fat saturation is kept more stable overall and significantly more robust with respect to fluctuations in the respiratory cycle. The recording pause, in other words the waiting time, during free respiration is therefore advantageously used to improve the data quality by improving the fat saturation.

This can be explained in greater detail using an example. For instance, with a repetition time of 2000 ms in the HASTE sequence, this gives an inversion time of approximately 130 ms in a specific example in the prior art where only one inversion pulse is emitted. Simply additionally emitting one further inversion pulse can cut this inversion time to approximately 100 ms, and with four additional inversion pulses an inversion time of just 80 ms is possible. It is conceivable for inversion times to be cut to 15 ms, for example.

It should be noted that a further advantage of the present invention is that with a higher repetition rate of the inversion pulse, the vulnerability of the recording technology to B1 and T1 variations is significantly reduced.

In an embodiment of the present invention, the at least one further inversion pulse is emitted at at least one defined moment in the respiratory cycle, in particular when a minimum and/or maximum of a respiratory curve determined by the respiratory signal is reached. For example, the inversion pulse can be additionally emitted approximately midway through the waiting time, for example during maximum inspiration. This moment can be determined on the basis of the respiratory signal, for example as a curve minimum, but it is also possible to determine the moment on the basis of the assumed respiratory period, i.e. the duration of a respiratory cycle. This doubles the repetition rate of the inversion pulse and results in a significant reduction in the inversion time. It is also possible to emit multiple further inversion pulses in this way, for example two to four additional inversion pulses. Moments for these emissions can be determined on the basis of the assumed respiratory period and/or from the respiratory signal itself.

In another embodiment, a navigator measurement, in particular of the diaphragm, is performed to determine the respiratory signal, with a further inversion pulse being emitted at every n-th recording of a navigator, where n is a natural number. Preferably, n can be equal to 1, i.e. the further inversion pulse is emitted during each recording of a navigator. Navigators are already known in the prior art and in particular in respiratory triggering. For example, in a one-dimensional navigator the movement of a boundary of the diaphragm is tracked, and the position of the diaphragm is then ultimately the respiratory signal or serves to derive it. Since regular control operations take place in the magnetic resonance apparatus in any case for the navigator measurements, these control operations can easily be supplemented by emitting the further inversion pulse, especially if additional inversion pulses are to be emitted particularly frequently, so that for example there is a particular large reduction in the inversion time.

The invention also concerns a magnetic resonance apparatus that has a controller configured to implement the inventive method. All embodiments relating to the inventive method can apply to the inventive magnetic resonance apparatus, with which the advantages already indicated can consequently also be obtained. The controller has the usual components to control the other of the magnetic resonance scanner in particular the radio-frequency coil arrangement and the gradient coil arrangement. In accordance with the invention, the controller has an additional or modified trigger unit that emits inversion pulse triggers for further inversion pulses in the waiting time. If the inversion triggers are determined from the respiratory signal, it is particularly expedient to expand a trigger unit that triggers the start of the sequence inversion pulse, inversion time and magnetic resonance sequence.

BRIEF DESCRIPTION OF THE DRAWINGS

FIG. 2 shows the sequence in relation to the respiratory signal in the present invention.

FIG. 3 shows an inventive magnetic resonance apparatus.

DESCRIPTION OF THE PREFERRED EMBODIMENTS

Figure 1:
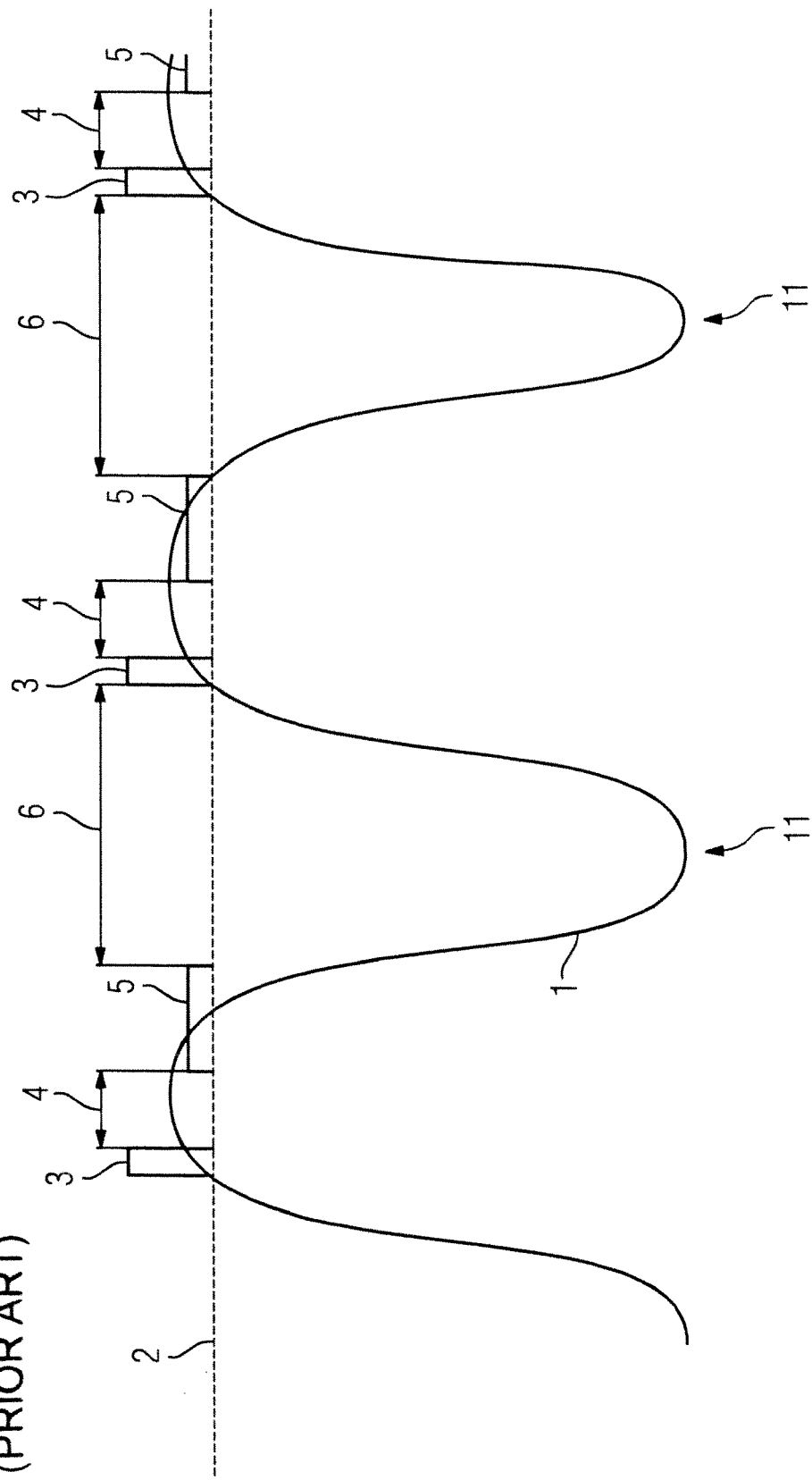
FIG. 1 shows a magnetic resonance data acquisition sequence in relation to the respiratory signal in the prior art.

FIG. 1 shows, in the form of an outline sketch, the characteristic 1 of a respiratory signal recorded with a navigator measurement, which is used for triggering the recording of magnetic resonance data using a HASTE sequence as a magnetic resonance sequence, wherein in this case the line 2 shows a trigger threshold. When the trigger threshold is reached, a sequence or measurement block starts, which is initiated by an inversion pulse 3. After the inversion pulse 3 it is necessary to wait for an inversion time 4, designated as T1, until the longitudinal magnetization of the fat spin is estimated to have reached the value zero, before the actual magnetic resonance sequence with the data recording 5 is emitted. Since a single-shot TSE sequence (HASTE sequence) is involved, a whole slice is recorded during a sequence of inversion pulse 3, waiting time 4 and data recording 5. Between these measuring blocks or sequences it is necessary to wait for a waiting time 6 until the recording criterion occurs once again, in other words the threshold value is reached once again, this being indicated by the line 2; during this time the respiratory signal is regularly captured via a navigator in the navigator measurement, wherein the minima 11 indicate the maximum inspiration in the characteristic 1.

There are two problems with this. Firstly, it can occur that part of the data recording 5 takes place during the magnetic resonance sequence already in regions of greater respiratory movement. Secondly, it can be assumed at an ideally constant respiratory frequency that the waiting times 6 are constant, thus the relaxation of the longitudinal magnetization of the fat spins has progressed equally far, and thus the inversion times 4 can be predicted equally securely and reliably. However, if there are changes in the respiratory frequency this is no longer the case. This can result in poorer quality magnetic resonance data, for which reason the present invention here proposes an improvement which is to be explained in greater detail by FIG. 2. In the interests of better visualization this shows a simple embodiment of the inventive method, whereby during the waiting time 6 at least one further inversion pulse 3' is emitted, in this case for greater clarity exactly one further inversion pulse 3', which is emitted at the moment of maximum inspiration, which can be determined from the respiratory signal, in other words relatively midway through the waiting time. However, it is conceivable and preferable to emit more than one additional inversion pulse 3'. This is because the additional inversion pulse 3' ensures that the longitudinal magnetization of the fat spins is less relaxed during the emission of the inversion pulses 3 and thus the inversion time 4' is shorter. If in the prior art, for example according to FIG. 1, the inversion time is 130 ins, then by emitting the one further inversion pulse 3', as illustrated in FIG. 2, a reduction to 100 ms is achieved; four additional inversion pulses permit a reduction to 80 ms, while emitting inversion pulses at each measurement of a navigator in the waiting time 6 permits a reduction in the inversion time down to small values of 15 ms.

Thus the method is not only more robust with respect to changes in the respiratory frequency, but the actual measurement operation, namely the emission of the magnetic resonance sequence with the data recording 5, can be initiated earlier after the occurrence of the recording criterion.

FIG. 3 shows a block diagram of an inventive magnetic resonance apparatus 7, which is as known, has a scanner 8 that defines a patient aperture 9, into which a patient can be transported by means of a patient couch. Surrounding the patient aperture 9 are a radio-frequency coil arrangement and a gradient coil arrangement, which are not shown here in detail. The operation of the magnetic resonance apparatus 7 is controlled by a control computer 10 which in this case is also designed to perform the inventive method, and therefore operates the scanner 8 to execute the aforementioned single-shot turbo spin echo sequence with SPAM fat suppression, and to emit further inversion pulses 3, during the respective waiting times 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance data comprising:
    operating a magnetic resonance scanner, while a patient is situated therein, said patient having a target region that is moved by respiration of the patient, to execute a single-shot turbo spin echo sequence to acquire magnetic resonance data from said target region;
    in said single-shot turbo spin echo sequence, operating said magnetic resonance scanner with Spectral Adiabatic Inversion Recovery (SPAIR) at fat saturation by multiple repetitions of a SPAIR sequence comprising radiation of an inversion pulse, followed by an inversion time and, after said inversion time, acquiring said magnetic resonance data;
    detecting a signal representing a respiratory cycle of said respiration of the patient and triggering each SPAIR repetition upon said signal fulfilling a predetermined data acquisition criterion;
    operating said magnetic resonance scanner to radiate a further inversion pulse in a waiting time between the respective SPAIR sequences; and
    providing said magnetic resonance data to a processor and, in said processor, generating a data file representing said magnetic resonance data and making said data file available in electronic form at an output of said processor.

2. A method as claimed in claim 1 comprising operating said MR scanner to emit said at least one further inversion pulse at a predetermined time in said respiratory cycle.

3. A method as claimed in claim 2 comprising selecting said predetermined time from the group consisting of a maximum of said signal and a minimum of said signal.

4. A method as claimed in claim 1 comprising operating said magnetic resonance scanner to execute a navigator measurement in which said signal representing the respiratory cycle is determined, and emitting said inversion pulse at every $n^{th}$ navigator measurement, wherein n is a natural number.

5. A method as claimed in claim 4 comprising emitting said further inversion pulse during each navigator measurement.

6. A method as claimed in claim 1 comprising operating said magnetic resonance scanner to execute a Half-Fourier Acquisition Single-Shot Turbo Spin Echo (HASTE) sequence as said single-shot turbo spin echo sequence.

7. A magnetic resonance apparatus comprising:
    a magnetic resonance scanner;
    a control computer configured to operate the magnetic resonance scanner, while a patient is situated therein, said patient having a target region that is moved by respiration of the patient, to execute a single-shot turbo spin echo sequence to acquire magnetic resonance data from said target region;
    said control computer being configured to operate said magnetic resonance scanner in said single-shot turbo spin echo sequence with Spectral Adiabatic Inversion Recovery (SPAIR) fat saturation by multiple repetitions of a SPAIR sequence comprising radiation of an inversion pulse, followed by an inversion time and, after said inversion time, acquiring said magnetic resonance data;
    a detector configured to detect a signal representing a respiratory cycle of said respiration of the patient, and said control computer being configured to trigger each SPAIR repetition upon said signal fulfilling a predetermined data acquisition criterion;
    said control computer being configured to operate said magnetic resonance scanner to radiate a further inversion pulse in a waiting time between the respective SPAIR sequences; and
    a processor provided with said magnetic resonance data, said processor being configured to generate a data file representing said magnetic resonance data and making said data file available in electronic form at an output of said processor.

8. A magnetic resonance apparatus as claimed in claim 7 wherein said control computer is configured to operate said magnetic resonance scanner as said detector, by executing a navigator measurement from which said control computer is configured to determine said signal representing the respiratory cycle.

* * * * *